United States Patent [19]

Yoshidome et al.

[11] Patent Number: 5,761,049
[45] Date of Patent: Jun. 2, 1998

[54] INDUCTANCE CANCELLED CONDENSER IMPLEMENTED APPARATUS

[75] Inventors: Hitoshi Yoshidome, Hadano; Takashi Maruyama, Ebina; Kazuo Hirota, Chigasaki, all of Japan

[73] Assignee: Hitachi, Ltd., Tokyo, Japan

[21] Appl. No.: 531,543

[22] Filed: Sep. 15, 1995

[30] Foreign Application Priority Data

Sep. 19, 1994  [JP]  Japan ................... 6-222935

[51] Int. Cl.⁶ .............................. H05K 7/02; H05K 9/00
[52] U.S. Cl. ........................ 361/782; 361/777; 361/811; 174/32; 174/33; 307/91; 307/109
[58] Field of Search .................. 361/272, 275.1, 361/306.1, 306.2, 306.3, 307, 308.1, 308.2, 308.3, 309, 310, 763, 766, 777, 782, 811, 821; 336/69, 70, 181; 307/89–91, 109; 174/32–34, 35 CE, 36, 35 R

[56] References Cited

U.S. PATENT DOCUMENTS

| | | |
|---|---|---|
| 4,274,124 | 6/1981 | Feinberg et al. ............... 361/275.1 |
| 4,814,940 | 3/1989 | Horstmann et al. ............ 361/306.2 |
| 5,122,924 | 6/1992 | Okumura ........................ 361/330 |
| 5,294,751 | 3/1994 | Kamada .......................... 174/35 R |
| 5,329,170 | 7/1994 | Rainal ............................ 327/565 |
| 5,379,189 | 1/1995 | Merriman ....................... 361/777 |
| 5,459,642 | 10/1995 | Stoddard ....................... 361/782 |
| 5,528,461 | 6/1996 | Gore et al. .................... 361/760 |

FOREIGN PATENT DOCUMENTS 2-202049  8/1990  Japan.

*Primary Examiner*—Leo P. Picard
*Assistant Examiner*—John B. Vigushin
*Attorney, Agent, or Firm*—Antonelli, Terry, Stout & Kraus, LLP

[57] ABSTRACT

An apparatus comprises a condenser such as a condenser for reducing power source noise to be implemented on a board, a conductor for supplying a current passing through the condenser, and a current path comprising conductors and components which are installed in the neighborhood of at least one of the condenser and conductor and the effective inductance component of the condenser is reduced by passing a current through the current path in the phase opposite to that of a current passing through the condenser and conductor.

14 Claims, 13 Drawing Sheets

BYPASS CONDENSER CROSS SECTION

TRACE PART CROSS SECTION

INDUCTANCE CANCELLED CONDENSER IMPLEMENTED APPARATUS

BACKGROUND OF THE INVENTION

1. Field of the Invention

The present invention provides a condenser whose effective inductance is reduced and an implementing structure thereof, and particularly relates to an art for reducing power source noise of a circuit board or LSI implementing electronic components, and also relates to an induced cancelled condenser implemented apparatus for improving the frequency characteristic of a condenser for reducing power source noise (hereinafter called a bypass condenser) which is implemented in a circuit board or LSI by reducing the effective impedance of the bypass condenser.

2. Description of the Prior Art

Describing the art of a bypass condenser mostly as a prior art relating to the present invention, an insertion type condenser with lead conductors or a leadless surface mounting type condenser is used as a bypass condenser. FIG. 9 shows a drawing of a bypass condenser which is implemented on a board and FIG. 10 shows an equivalent circuit of a bypass condenser. By a conventional implementing method, as described on pages 311 to 313 of "Noise Reduction Technology in Electronic Systems, Second Edition" (by Henry W. Ott, translated by Hiroichi Deguchi, Jatec Print), a bypass condenser is indicated by an equivalent circuit in which an inductance 11 exists in series of a condenser 12 as shown in FIG. 10.

Therefore, the impedance characteristic of the bypass condenser becomes high in the high frequency zone as shown in FIG. 12 compared with the frequency characteristic of a pure condenser shown in FIG. 11. It may be said that the capacity 12 shown in the equivalent circuit diagram in FIG. 10 is dominant in the low frequency zone A shown in FIG. 12 and the inductance 11 is reversely dominant in the high frequency zone B. Assuming the value of the inductance 11 as L and the value of the capacity 12 as C, the frequency at the boundary between the zone A and the zone B is a series resonance frequency of fr=½ π√LC shown in the equivalent circuit diagram in FIG. 10. From this formula, two methods for improving the frequency characteristic of a bypass condenser may be considered such as making C smaller and making L smaller.

When C is made smaller, it is necessary to reduce C to ¼ so as to double fr. As a result, although the frequency characteristic of an individual condenser is improved when C is made smaller, the total capacity of the condensers becomes smaller for the current to be supplied. Therefore, when C of a bypass condenser is made smaller, it is necessary to increase the number of bypass condensers or to connect a bypass condenser having a large capacity separately in parallel and the total number of components of the board will be increased.

On the other hand, when L is made smaller, the frequency characteristic of a bypass condenser can be improved without reducing the total capacity of the bypass condenser. Namely, to improve the frequency characteristic of a bypass condenser without increasing the number of components, it is advantageous to make L of the bypass condenser smaller.

There are two methods for making L smaller available. One is a method for making the distance between each component requiring a current and a bypass condenser shorter so as to make the length of current path shorter and the other is a method for canceling a magnetic flux generated by a current. Generally in the former method, an individual component is made smaller in shape and the intervals between components are made narrower.

Particularly, L of a bypass condenser is mostly caused by lead conductors of the component and traces of pads. Therefore, methods for using a leadless surface mount type condenser, making pads shorter, and making a throughhole in each pad have been designed. As disclosed in Japanese Patent Application Laid-Open 2-202049, a bypass condenser may be implemented in an LSI package.

The operating frequencies of recent digital equipments and communication technology equipments are increasing higher and higher and the frequencies of currents passing during operation of devices such as ICs and LSIs are increased. Therefore, to shorten the path lengths between these devices, the power source, and the ground, a structure of multi-layer board (multi-layer PWB (printed wiring board)) is used and the power supply layer, ground layer, and components are connected to each other with through-holes.

However, even if the inductance is reduced by using the leadless component and the traces of the pads as far as possible like this, the impedance of the bypass condenser does not reduce sufficiently, and power source noise increases, and furthermore radiation noise radiated from the circuit board due to the power source noise increases. To reduce the power source noise, it is necessary to improve the frequency characteristic of the bypass condenser by reducing its capacity, and increase the number of bypass condensers. As a result, the area occupied by bypass condensers on the circuit board increases and the space efficiency of the circuit board decreases.

SUMMARY OF THE INVENTION

An object of the present invention is to eliminate the difficulties of the prior arts mentioned above and to provide a condenser for reducing the effective inductance component and a condenser implementing structure. Another object of the present invention is to provide a circuit board or LSI package using an implementing method for reducing the effective inductance of such a condenser or the effective inductance of such a condenser by implementing the condenser and improving the frequency characteristic of the bypass condenser without reducing the capacity.

To accomplish the above objects, an apparatus implementing the condenser of the present invention comprises a condenser, a conductor for supplying a current passing through the condenser, and a current path which is installed in the neighborhood of at least one of the condenser and conductor and a current passing through the current path is in the phase opposite to that of the current passing through the condenser and conductor.

When a circuit board implementing a condenser for reducing power source noise is used, a means for passing a current in the phase opposite to that of the condenser for reducing power source noise is installed in the neighborhood of the condenser for reducing power source noise.

As a system for realizing a means for passing a current in the opposite phase, a method operated when a conductor is installed in the neighborhood of a condenser for generating an induced current in the adjacent conductor by a current passing through the condenser, a method for allowing the forward path and return path of a current to neighbor with each other, or a method for implementing the same type of condensers in the opposite direction each other may be mounted.

The present invention having the aforementioned constitution has the function and operation indicated below.

The present invention uses a method for reducing the inductance by canceling a magnetic flux. FIGS. 13 and 14 show the principle of the present invention. As shown in FIG. 13, when a current i passes, a magnetic flux is generated around it. When i changes with time, $d\Phi/dt$ is generated by a change with time $di/dt$ of this i. Inverse electro motive force V in the opposite direction for canceling i is generated by this $d\Phi/dt$. In this case, the inductance L is defined by $V=Ldi/dt$.

On the other hand, when a current $i2=-i1$ passes in the neighborhood of a current i1 as shown in FIG. 14, $\Phi 1+\Phi 2=0$ in the neighborhood of i1 and i2 due to $\Phi 2$ generated by i2. Therefore, $d\Phi/dt=d(\Phi 1+\Phi 2)/dt=0$, thus inverse electro motive force V will not be generated.

Actually, $\Phi$ is not canceled perfectly, so that V will not become 0. However, the inverse electro motive force V becomes smaller than that when only i1 passes. Therefore, by passing a current in the opposite direction in the neighborhood of the condenser, the apparent inductance L of the condenser and the effective inductance can be reduced.

According to the present invention, the power source noise of the circuit board can be reduced without increasing the number of bypass condensers.

The foregoing and other objects, advantages, manner of operation and novel features of the present invention will be understood from the following detailed description when read in connection with the accompanying drawings.

DETAILED DESCRIPTION OF THE PREFERRED EMBODIMENTS

The embodiments applied to a condenser for reducing power source noise and an implementing structure thereof will be explained concretely in detail with reference to the accompanying drawings.

Figure 1:
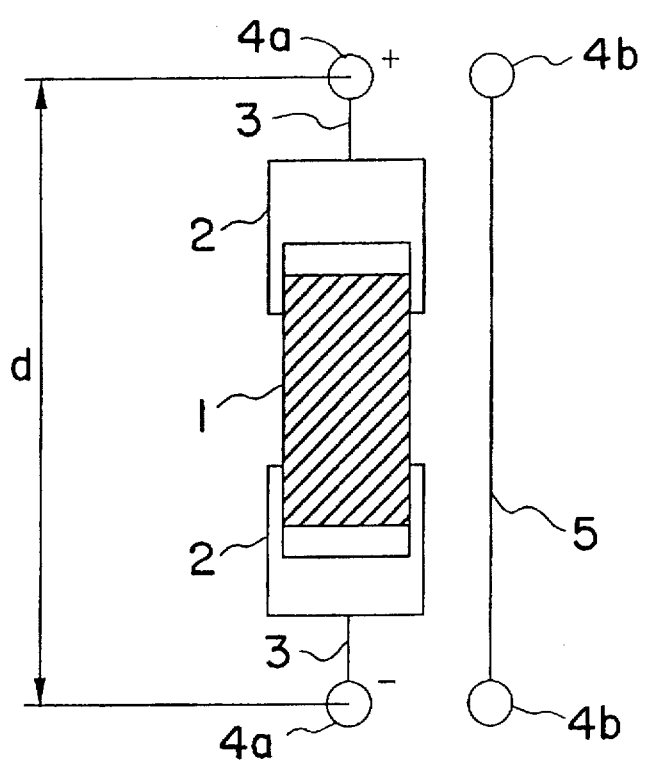
FIG. 1 is a drawing showing the first embodiment of the present invention.
Figure 2A:
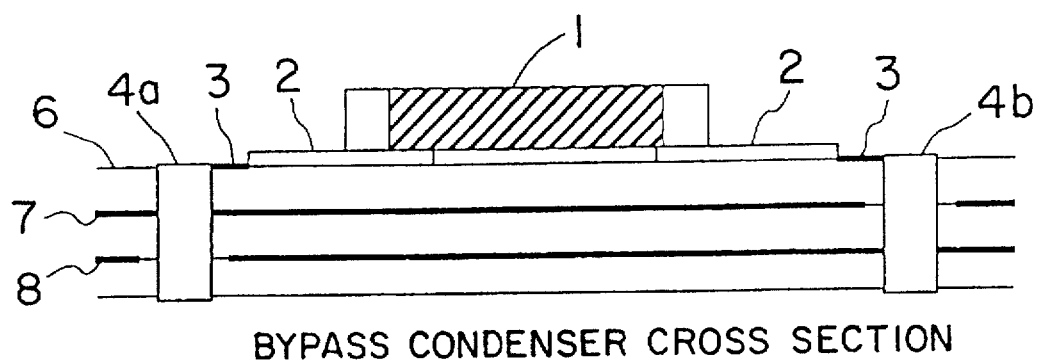
FIGS. 2a and 2b are cross sectional views of the first embodiment of the present invention.
Figure 2B:
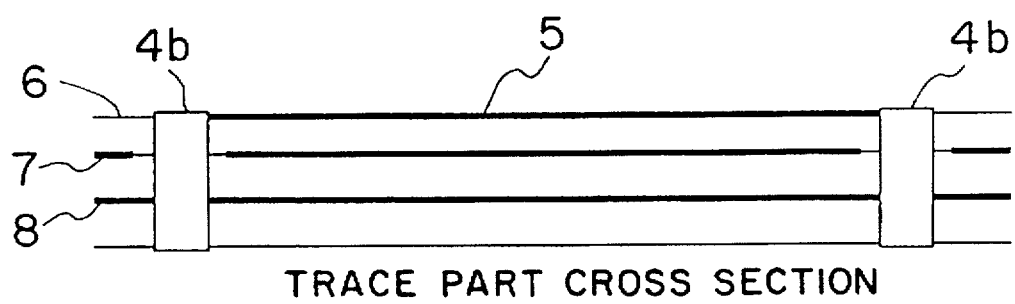

FIG. 1 is a drawing showing the first embodiment of the present invention and FIGS. 2a and 2b are cross sectional views thereof. In FIGS. 1 and 2a, 2b numeral 1 indicates a condenser for reducing power source noise implemented on a board 6, 2 a pad for implementing the condenser 1 which is installed on the board 6, 3 a conductive trace which is installed on the board 6, and 4 a through-hole which is made in the board 6.

In this embodiment, the condenser 1 is a leadless surface mounting type condenser.

However, an insertion type condenser with lead conductors may be used without trouble.

The surface mounting type condenser 1 is connected to the pad 2 with solder. One electrode of the condenser 1 is connected to a power supply layer 7 via the pad 2, the lead conductor 3, and the through-hole 4a and the other electrode is also connected to a ground layer 8 via the pad 2, the lead conductor 3, and the through-hole 4b. For simplicity of explanation, the condenser 1, the pad 2, the trace 3, and the through-hole 4 will be called a bypass condenser assembly.

A conductor 5 is connected immediately beside the bypass condenser assembly in parallel with it. As shown in FIGS. 1 and 2a, 2b the conductor 5 is connected to the ground layer 8 at both ends via the through-holes 4b. In this case, it is desirable that the length of the conductor 5 is set to a value which is equal to or not different extremely from the distance d between the through-hole 4a and the through-hole 4b of the bypass condenser assembly. The self inductance of the bypass condenser assembly is determined by the distance d. When the distance d is extremely long, the inductance increases extremely. It is desirable that the distance d is controlled to up to about 5 mm. When a current passes through the bypass condenser assembly, a current in the direction opposite to that of the current passing through the bypass condenser assembly is induced in the conductor 5.

It is desirable that the width of the conductor 5 is similar to that of the trace 3 of the bypass condenser assembly. Even when the conductor 5 is wider, it is necessary that the width of the conductor 5 is about 2 to 4 times of that of the trace 3. It is important to fit the impedance of the conductor 5 to the impedance of the bypass condenser assembly because the impedance of the bypass condenser assembly is determined by the trace 3. The reason that the thickness of the conductor 5 is limited is that when the conductor 5 is excessively wide, the connection between the conductor and the ground layer becomes too strong and no improvement effect of the frequency characteristic of the bypass condenser can be obtained.

It is desirable to install the conductor 5 as close to the bypass condenser assembly as possible. Since the minimum conductor interval is specified by the board conductor standard, it is desirable that the distance between the conductor 5 and the bypass condenser assembly is the one specified by the minimum conductor interval. It is often set to about 0.15 mm. Even if the distance is longer than it, some effect may be produced. However, it is desirable that the distance is up to about 0.3 mm from a result of calculation of the crosstalk factor when the frequency is about 100 MHz. When it is necessary to consider a higher frequency, it is necessary to reduce the value in reverse proportion to the frequency.

According to this embodiment, there is no need to add a component newly so as to pass a current in the phase opposite to that of the current passing through the bypass condenser and the frequency characteristic of the bypass condenser can be improved only by a pattern design of the board. Even if the conductor 5 is connected to the power supply layer 7 at both ends instead of the ground layer 8, the same effect can be obtained.

Figure 3:
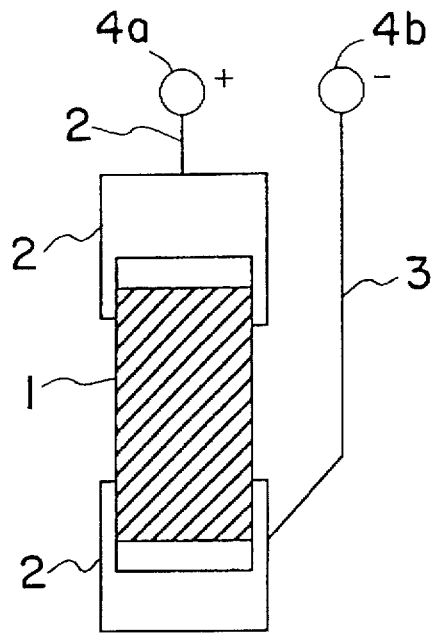
FIG. 3 is a drawing showing the second embodiment of the present invention.

Next, the second embodiment of the present invention will be explained by referring to FIG. 3. In FIG. 3, the same parts as those shown in FIG. 1 are assigned with the same numbers. Among the through-holes 4, the through-hole 4a is a through-hole connecting to the power supply layer 7 and the through-hole 4b is a through-hole connecting to the ground layer 8 (the same may be said with FIG. 4 and the subsequent drawings).

As shown in FIG. 3, according to this embodiment, one of the traces 3 of the bypass condenser assembly is laid beside and in parallel with the condenser 1, and the other trace 3 is connected to the through-hole 4a, and the through-hole 4b is installed just beside the through-hole 4a, and both traces 3 are connected to the inner layers via the through-holes. In this embodiment, the trace 3 on the side of the through-hole 4b which is connected to the ground layer 8 is structured as mentioned above. However, the trace 3 on the side of the through-hole 4a which is connected to the power supply layer 7 may be structured as mentioned above. According to this embodiment, there is no need to add a component newly so as to pass a current in the phase opposite to that of the current passing through the condenser 1 and the frequency characteristic of the bypass condenser can be improved only by a pattern design of the board. Compared with the first embodiment shown in FIG. 1, there is an effect produced that there are not many through-holes and the wiring efficiency is not reduced.

Figure 4:
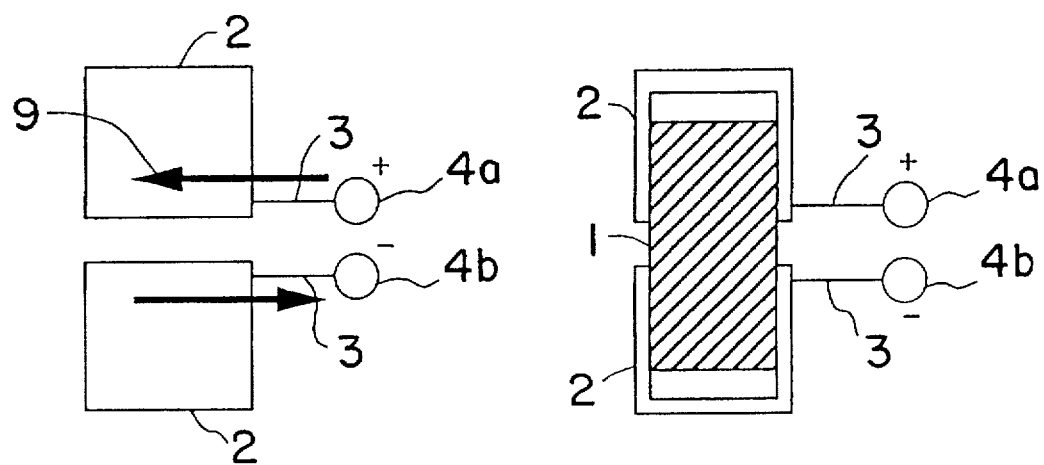
FIG. 4 is a drawing showing the third embodiment of the present invention.

FIG. 4 is a drawing showing the third embodiment of the present invention. In this example, the traces 3 are pulled out from the pads 2 beside the condenser 1 and the two traces 3 are laid close to each other and connected to the through-holes 4a and 4b respectively. According to this example, the currents passing through the traces 3 are a pair of currents 9 in the opposite phase to each other (indicated by the arrows shown in FIG. 4). According to this embodiment, there is no need to add a component newly so as to pass a current in the phase opposite to that of the current passing through the bypass condenser and the frequency characteristic of the bypass condenser can be improved only by a pattern design of the board. Since there is not a current for canceling the current passing through the condenser portion, the improvement effect of the frequency characteristic is inferior to those of the first embodiment and the second embodiment. However, the implementing area can be reduced and the space efficiency of the board can be improved.

Figure 5:
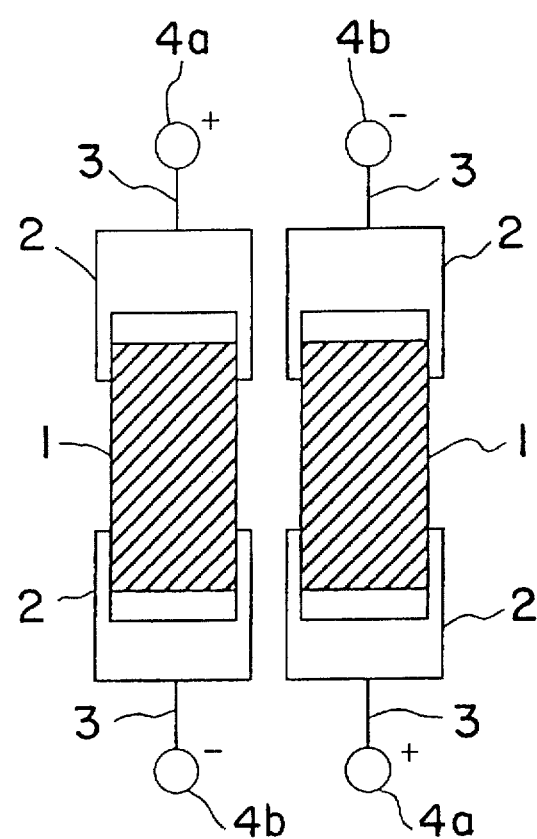
FIG. 5 is a drawing showing the fourth embodiment of the present invention.

FIG. 5 is a drawing showing the fourth embodiment of the present invention. In this embodiment, in place of the conductor 5 in the first embodiment shown in FIG. 1, the same type of bypass condensers are implemented in parallel with each other. The through-holes 4a which are located diagonally are connected to the power supply layer and the two remaining through-holes 4b are connected to the ground layer. By doing this, the two condensers 1 are implemented in parallel with each other and electrically reversely. When the size of each condenser is several mm or less, it is sufficiently small compared with the wave length of power source noise at a frequency of 1 GHz or less. Therefore, the currents passing through the two condensers are the same in the phase and reverse in the passing direction and produce an effect for canceling the respective magnetic fluxes.

Figure 6:
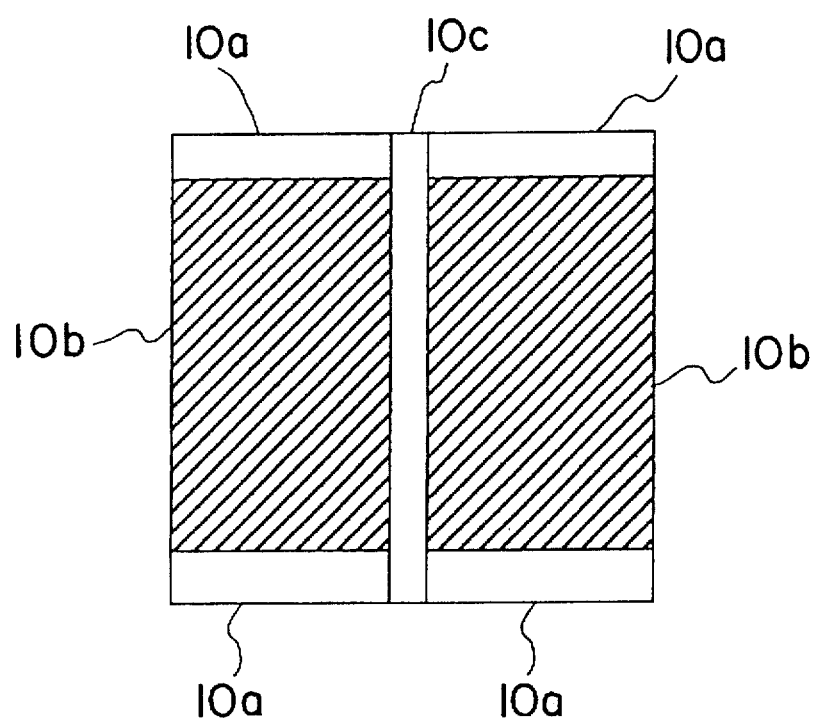
FIG. 6 is a drawing showing an example of a composite bypass condenser.
Figure 7:
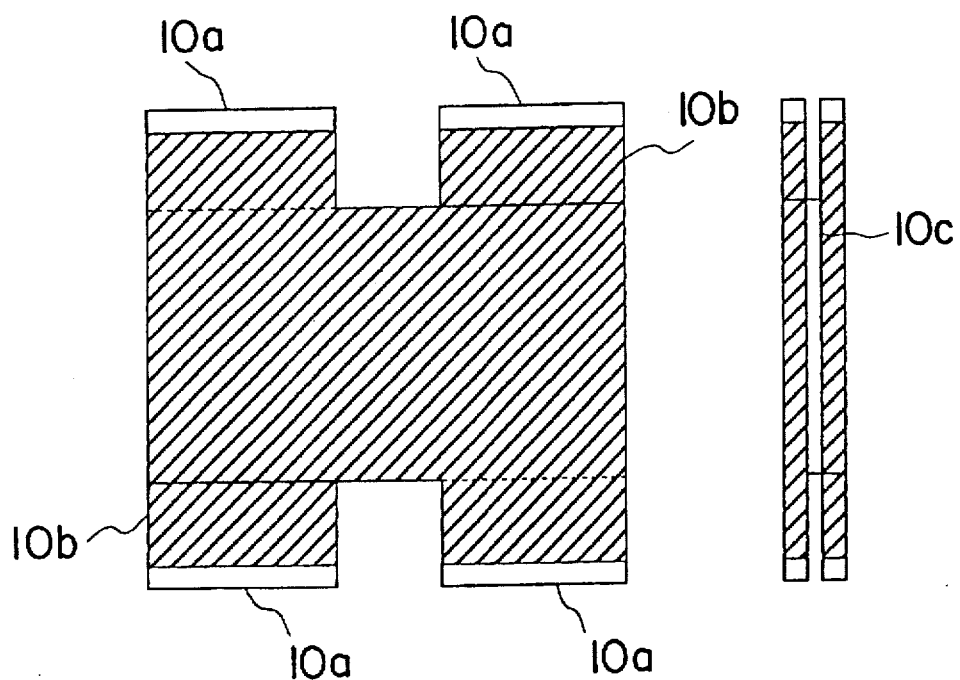
FIG. 7 is a drawing showing another example of a composite bypass condenser.
Figure 8:
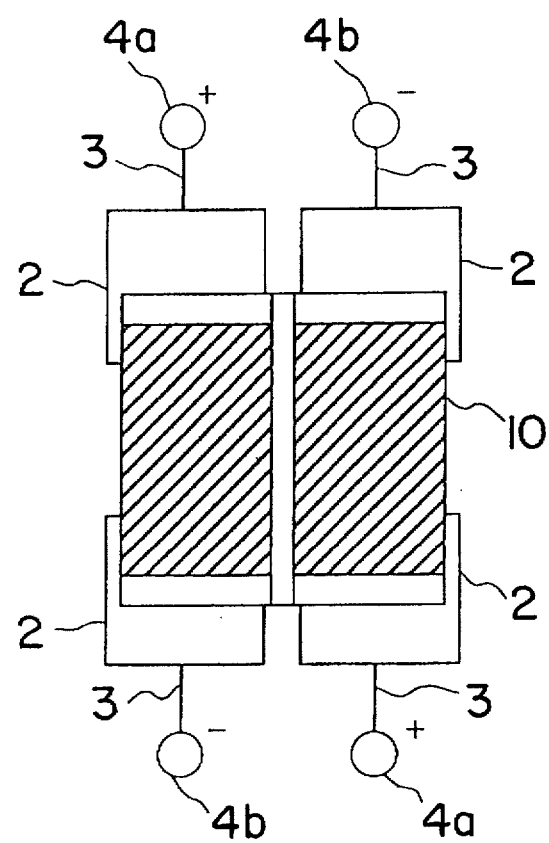
FIG. 8 is a drawing showing the fifth embodiment of the present invention.
Figure 9:
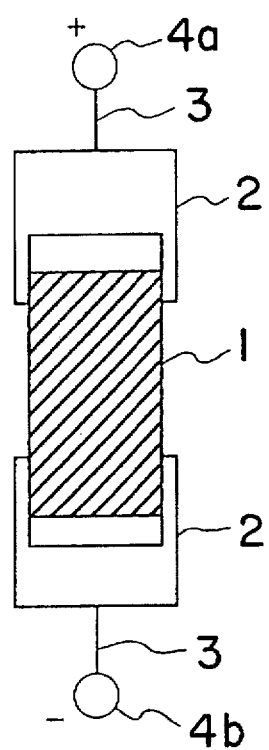
FIG. 9 is a drawing showing a conventional bypass condenser.
Figure 10:
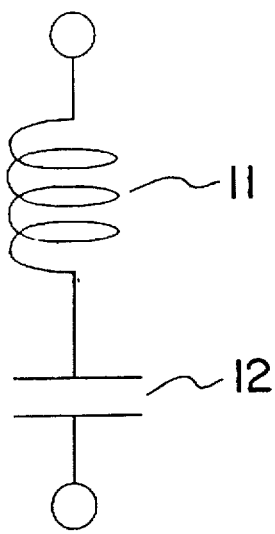
FIG. 10 is a drawing showing an equivalent circuit of a bypass condenser.
Figure 11:
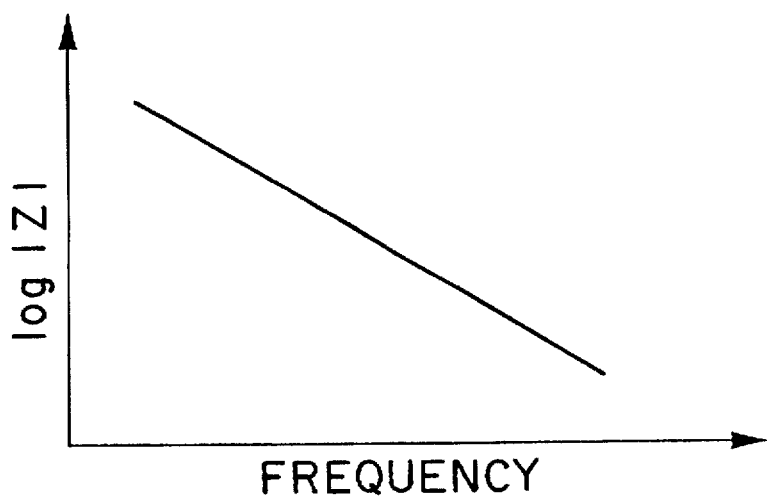
FIG. 11 is a drawing showing the frequency characteristic of a pure condenser.
Figure 12:
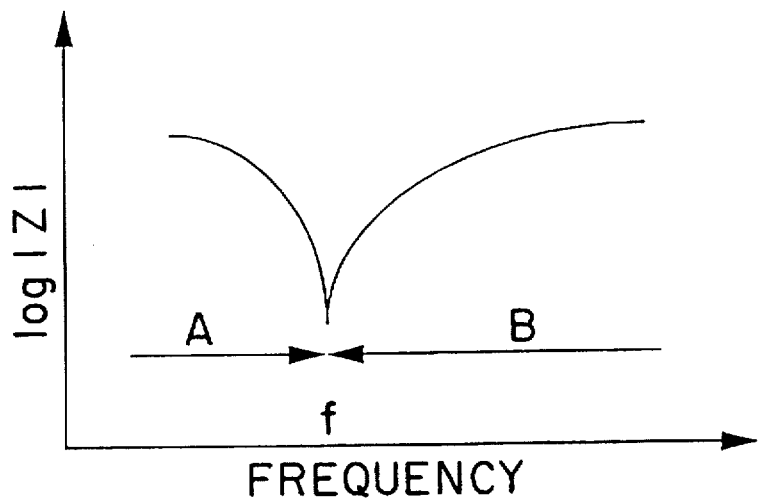
FIG. 12 is a drawing showing the frequency characteristic of a bypass condenser.
Figure 13:
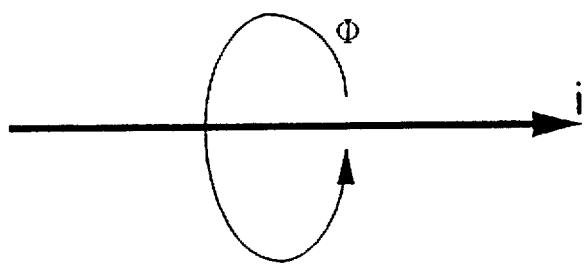
FIG. 13 is a drawing showing magnetic flux generated around a current.
Figure 14:
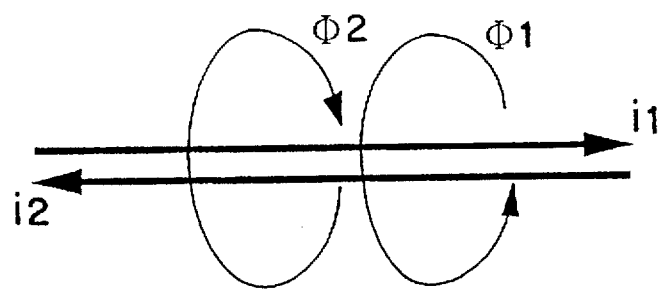
FIG. 14 is a drawing showing magnetic flux generated around a current in the opposite direction.
Figure 15:
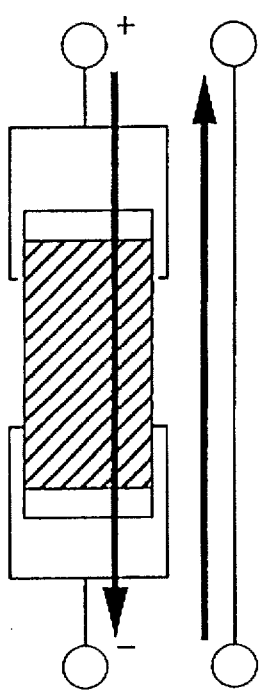
FIG. 15 is a drawing showing the flow of the current in the first embodiment of the present invention.

Next, the fifth embodiment of the present invention will be explained by referring to FIGS. 6, 7, and 8. FIG. 6 is a drawing showing a condenser used in this embodiment, and FIG. 8 is a drawing showing a board implementing the condenser shown in FIG. 6, and FIG. 7 is a drawing showing another example of a condenser used in this embodiment.

Firstly, the composite condenser shown in FIG. 6 will be explained. A normal condenser has a structure that electrodes are connected to both ends of an insulator (dielectric). A composite condenser forms condensers in which electrodes 10a are attached to both ends of an insulator (dielectric) 10b and connects the condensers across a separating insulator 10c from each other. The insulators 10b are made of a material having a high dielectric constant such as ceramics. The dielectric constant of the insulator 10c is sufficiently lower than that of the insulators 10b so as to prevent a high-frequency current from passing through the insulator 10c.

When a composite condenser comprising three or more condensers is used, every two condensers are connected to each other across an insulator 10c from each other. When a polarized insulator such as tantalum is used as each insulator 10b, the insulators 10b are arranged and connected to each other so that the polarities of the insulators are reversed alternately. In this composite condenser, even if two or more condensers are connected to each other so as to form a component and a high-frequency voltage is applied between the electrodes 10a of each condenser, the current path can be restricted to inside the insulator 10b so as to prevent the current from passing through the other condenser.

Next, an example of another composite condenser shown in FIG. 7 will be explained. In the composite condenser shown in FIG. 6, two condensers are arranged and connected in parallel with each other. In this example, condensers are overlaid and connected to each other vertically. In this example, electrodes 10a are attached to a crank-shaped insulator 10b so as to form a condenser. A condenser which is shaped reversely on the right and left with this condenser is prepared and the two condensers are connected across an insulator 10c from each other so as to form a composite condenser as a component. In this composite condenser, a main current passing through each condenser passes through the central portion of the condenser. Therefore, according to this example, compared with the composite condenser shown in FIG. 6, the distance between the currents passing through the condensers can be made shorter. The distance of a current passing through each condenser in the opposite phase can be made longer for the implementing area. On the other hand, the composite condenser shown in FIG. 6 is simple in shape and can be formed easily.

In the case of a composite condenser, compared with an individual condenser, an effect that the interval between the condensers can be made narrower and the overlapping distance of currents in the opposite phase becomes longer (the connection becomes stronger) can be obtained.

FIG. 8 is a drawing showing the status when the composite condenser shown in FIG. 6 is implemented on a board. Numeral 10 indicates a composite condenser, 2 a pad, 3 a trace, and 4a and 4b through-holes. The two pads 2 which are located diagonally are connected to the power supply layer 7 which is an inner layer of the board via the trace 3 and the through-hole 4a and the two remaining pads 2 which are located diagonally are connected to the ground layer 8 which is an inner layer of the board via the trace 3 and the through-hole 4b. The composite condenser 10 is implemented so that the power source and ground are connected to both ends of each condenser constituting the composite condenser. By doing this, a voltage is applied to each condenser constituting the composite condenser 10 alternately in the reverse direction.

Figure 16:
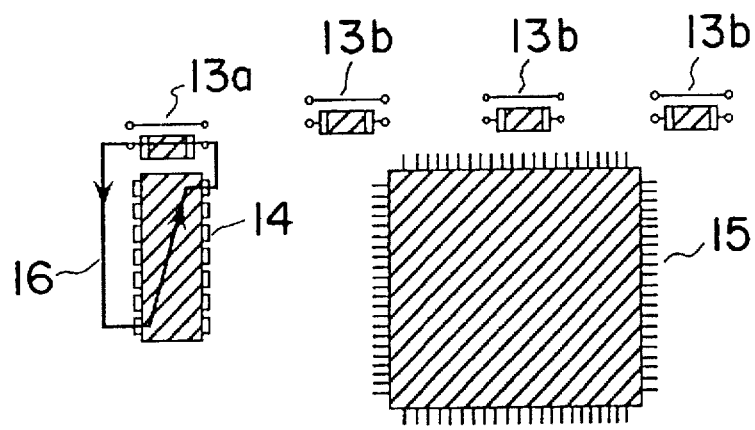
FIG. 16 is a drawing showing the relation between a bypass condenser and other components implemented on a board.
Figure 17:
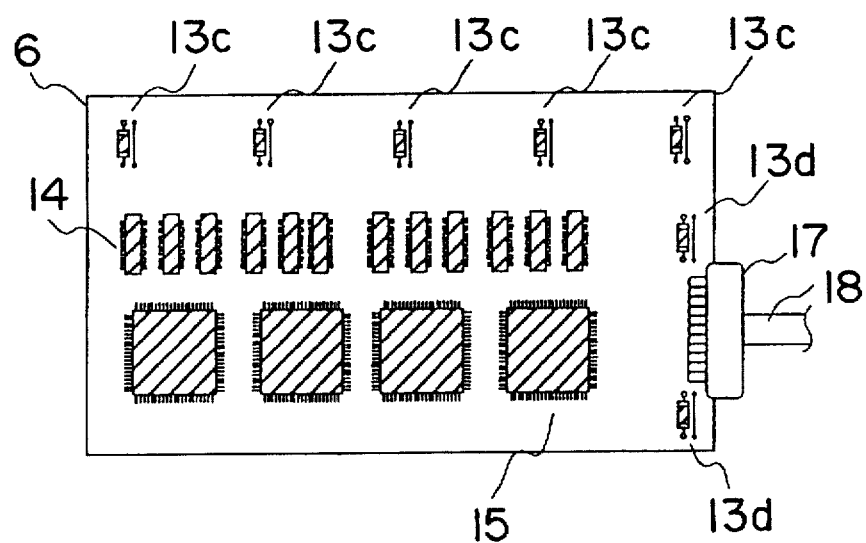
FIG. 17 is another drawing showing the relation between a bypass condenser and other components implemented on a board.

FIGS. 16 and 17 show drawings of a bypass condenser which is implemented on a board together with other components.

As shown in FIG. 16, it is desirable to realize a bypass condenser assembly 13b of the present invention in the neighborhood of the electrode of an IC 14 so that the area of a current loop 16 which is formed by a power supply pin and a GND pin (ground pin) of the IC 14 and a bypass condenser assembly 13a of the present invention is minimized. A bypass condenser assembly 13b of the present invention is realized in the neighborhood of the electrode of an LSI 15 so that the area of a current loop which is formed by a power supply pin and a GND pin of the LSI 15 and a bypass condenser assembly 13b of the present invention is minimized. When components are implemented on both sides of the board, they are implemented just at the back of the LC 14 or LSI 15 so as to minimize the loop area of power supply current.

As shown in FIG. 17, when a bypass condenser assembly 13c of the present invention is realized in a wide free location of the board even if it is farther away from the implementation location of the IC 14 or LSI 15 or at an end of the board or a bypass condenser assembly 13d of the present invention is realized in the neighborhood of a cable or connector which will be an interface with an external board, the power source noise generated overall the board can be reduced, and the power source noise is prevented from transmitting to the cable, and the radiation noise can be reduced.

Figure 18:
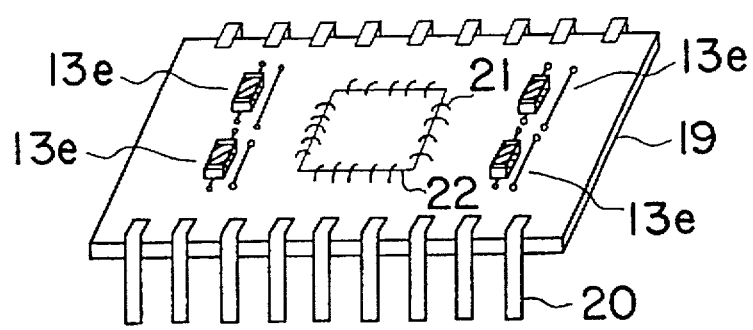
FIG. 18 is an enlarged sketch drawing of an LSI package to which the present invention is applied.

FIG. 18 is a sketch drawing of an LSI package to which the implementation structure of the present invention is applied and it is the same as with the aforementioned circuit board. An LSI chip 22 is implemented on a board 19 and connected to the conductors of the board 19 by wire bonding 21. The conductors are led to the ends of the board and connected to lead conductors 20 for external connection. A condenser for reducing power source noise is implemented on the board 19 as close to the LSI chip 22 as possible. FIG. 18 shows a hybrid IC as an example. However, a condenser for reducing power source noise can be implemented also in an LSI package such as a PGA (pin grid array) or a BGA (pin ball array) having a multi-layer structure so as to reduce power source noise.

A case for reducing power source noise has been described above in detail. However, needless to say, as mentioned above, the present invention can be applied to all apparatuses implementing a condenser which is required to reduce the effective inductance component of the condenser.

Also in the aforementioned bypass condenser, the present invention obtains good results such that the frequency characteristic of the condenser (bypass condenser) for reducing power source noise can be improved and since the power source noise can be reduced, malfunctions of the circuit and radiation noise caused by power source noise can be reduced without increasing the number of bypass condensers.

The invention claimed is:

1. An apparatus implementing a condenser comprising:

a condenser implemented in said apparatus as one component part of said apparatus;

a conductor for supplying a current passing through said condenser; and another component part of said apparatus implemented adjacent to said condenser for passing a current in a phase opposite to that of a current passing through said condenser and conductor.

2. An apparatus according to claim 1, wherein the apparatus is a board.

3. An apparatus according to claim 1, further comprising means for passing a current through said another component part of said apparatus in a phase opposite to that of a current passing through said condenser and conductor.

4. An apparatus according to claim 3, wherein the apparatus is a board implementing a condenser for reducing power source noise.

5. An apparatus according to claim 4, wherein said another component part includes at least one other condenser, the condenser for reducing power source noise and the at least one other condenser having a fixed-direction polarity, respectively, and connected to each other with each polarity reversed.

6. An apparatus according to claim 5, wherein the condenser and the at least one other condenser are connected in parallel with each other so as to be reversely polarized, respectively.

7. A board implementing a condenser for reducing power source noise comprising:

a condenser for reducing power source noise implemented on said board as one component part of said board;

a conductor for supplying a current passing through said condenser; and another component part on said board implemented adjacent to said condenser for passing a current in a phase opposite to that of a current passing through said condenser and conductor.

8. A board according to claim 7, wherein said another component part on said board for passing a current in the opposite phase is another conductor which is installed in parallel with said condenser and connected to the ground or power source at both ends.

9. A board according to claim 8, wherein said another conductor is connected to said ground or power source at a distance almost equal to the distance between two through-holes to which said condenser for reducing power source noise is connected.

10. A board according to claim 7, wherein said another component part on said board is one of traces of said condenser for reducing power source noise laid along said condenser for reducing power source noise.

11. A board according to claim 7, wherein said condenser for reducing power source noise is implemented via pads installed on said board and said another component part on said board is traces of a power supply conductor and a ground conductor which are led from said pads so that they are closest to each other.

12. A board according to claim 7, wherein said another component part on said board is a reversely polarized condenser which is installed in parallel with said condenser for reducing power source noise.

13. A board according to claim 7, wherein said another component part on said board for passing a current in the opposite phase comprises condensers for reducing power source noise constituting a composite condenser which are connected in parallel with each other so as to be reversely polarized respectively.

14. A board according to claim 7, further comprising means for passing a current through said another component part on said board in a phase opposite to that of a current passing through said condenser and conductor.

* * * * *